United States Patent
Schuelke

(10) Patent No.: US 7,877,652 B1
(45) Date of Patent: Jan. 25, 2011

(54) DETECTION CIRCUIT AND METHOD FOR AC COUPLED CIRCUITRY

(75) Inventor: Robert John Schuelke, Lakeville, MN (US)

(73) Assignee: QUALCOMM Incorporated, San Diego, CA (US)

( * ) Notice: Subject to any disclaimer, the term of this patent is extended or adjusted under 35 U.S.C. 154(b) by 1376 days.

(21) Appl. No.: 10/404,573

(22) Filed: Mar. 31, 2003

(51) Int. Cl.
G01R 31/28 (2006.01)

(52) U.S. Cl. ...................................... 714/727

(58) Field of Classification Search .......... 714/727 KW
See application file for complete search history.

(56) References Cited

U.S. PATENT DOCUMENTS

| | | | | |
|---|---|---|---|---|
| 4,839,878 A * | 6/1989 | Inoue | ........................ | 369/53.2 |
| 5,673,130 A * | 9/1997 | Sundstrom et al. | .......... | 398/154 |
| 6,662,134 B2 * | 12/2003 | Moore | ........................ | 702/117 |
| 6,691,269 B2 * | 2/2004 | Sunter | ........................ | 714/727 |
| 6,763,486 B2 * | 7/2004 | Lai et al. | ..................... | 714/727 |
| 6,877,121 B1 * | 4/2005 | Srinivasaiah et al. | ........ | 714/727 |
| 2003/0229835 A1 * | 12/2003 | Whetsel | ..................... | 714/727 |

OTHER PUBLICATIONS

IEEE Standard Test Access Port and Boundary-Scan Architecture. IEEE Std 1149.1-1990.*

* cited by examiner

Primary Examiner—Jeffrey A Gaffin
Assistant Examiner—Steve Nguyen
(74) Attorney, Agent, or Firm—Jiayu Xu

(57) ABSTRACT

Standardized scan cell logic is enabled to test board-level and circuit-level AC interfaces built into integrated CMOS circuits by verification of high-speed AC coupled non-CMOS logic level signals driven onto non-CMOS logic level AC coupled interconnects in those circuits.

10 Claims, 4 Drawing Sheets

DETECTION CIRCUIT AND METHOD FOR AC COUPLED CIRCUITRY

FIELD OF THE INVENTION

The present invention relates generally to electronic circuits. More particularly, the present invention relates to a circuit for the detection of manufacturing defects in an integrated circuit and/or in an integrated circuit board assembly.

BACKGROUND OF THE INVENTION

The detection of circuit board manufacturing defects is a long-established and standardized industry practice. The industry standard practices for these methods are described in IEEE Standard 1149. This standard method of testing is often referred to as JTAG in reference to the Joint Test Action Group standards committee from which it originated. That standard stipulates the test methodology and interface protocols for implementing different types of test functions that allow a board manufacturer to verify that circuit boards and associated integrated circuits ("ICs") are manufactured properly. The JTAG standard is specific to CMOS logic circuits—unfortunately, the JTAG standard does not address in detail the testing of analog or AC coupled circuitry.

One aspect of the standard involves the verification of the board level interconnect between ICs. In the methodology described in the standard it is assumed that the connection between the ICs is a DC coupled connection and that the signal levels are commensurate with standard CMOS logic. In these instances the standard calls for a boundary scan cell to be placed at the input and output ("I/O") pins of the interconnect. The dedicated test interface then allows the tester to force a specified DC logic level out of the driving IC and to determine the logic level received at the input end of the connection. If the correct anticipated pattern is received, then the interconnect is deemed to be manufactured correctly and to be viable.

There are, however, a significant number of instances where interconnect signals between ICs are AC coupled and do not conform to CMOS logic levels. AC coupled circuits typically require a coupling capacitor between circuits to block DC current during the transmission of AC signals. An example would be an AC coupled high-speed differential current mode logic ("CML") level interface between a physical media dependent ("PMD") device and a physical layer ("PHY") device in a data communication link. In this situation the prescribed DC CMOS logic test methodologies would not be successful in verifying the connection. Consequently, a different approach is required for testing the AC interconnection between CMOS logic circuits or CMOS ICs.

One recent proposal has been made for adaptation or modification of the JTAG standard to permit the introduction of an alternating AC signal into non-CMOS logic level AC coupled interconnects. This proposal may be termed "ACJTAG". The signal is synchronously sampled on the receiver side at intervals to determine if the signal was appropriate to the anticipated interconnect. If the received pattern is consistent with expectations, the interconnect is deemed correct. Otherwise, the assumption is made that there is a defect in the interconnect between the ICs under test. However, this proposal has not set forth a means and mode for interconnection of the test logic to high speed AC coupled signal lines.

Our invention enables the detection and interfacing of high-speed AC coupled non-CMOS logic level signals into ACJTAG logic by allowing an alternating AC signal to be driven onto non-CMOS logic level AC coupled interconnects; it is applicable as well to non-CMOS level single-ended and differential signals with or without AC coupling. This AC signal is synchronously sampled on the receiver side at intervals to determine if the signal is appropriate to the anticipated interconnect. If the received pattern is consistent with expectations, the interconnect is deemed correct. Otherwise it is assumed that there is an issue with the manufacturing process.

While the above proposal outlines the digital portion of the test methodology, it does not define how to interface the logic to the high-speed AC coupled signal lines.

BRIEF SUMMARY OF THE INVENTION

An integrated circuit architecture and methodology according to the present invention provides a means to detect manufacturing defects in an AC coupled circuitry interconnect. The techniques of the present invention are compatible with existing standard test methodologies, such as the JTAG standard.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware, software, and/or firmware components configured to perform the specified functions. For example, the present invention may employ various integrated circuit components, e.g., amplifiers, logic elements, look-up tables, clock elements, and the like, which may carry out a variety of functions under the control of one or more microprocessors or other control devices. In addition, those skilled in the art will appreciate that the present invention may be practiced in conjunction with any number of integrated circuits and that the specific functionality of such integrated circuits is unimportant.

It should be appreciated that the particular implementations shown and described herein are illustrative of the invention and its best mode and are not intended to otherwise limit the scope of the invention in any way. Indeed, for the sake of brevity, conventional techniques related to digital logic and control, multiplexer operation, boundary scan cells, JTAG testing methodologies, and other functional aspects of the circuits (and the individual operating components of the circuits) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

The following description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits are not adversely affected).

As used herein, a "node" means any internal or external reference point, connection point, junction, signal line, conductive element, or the like at which a given signal, logic level, voltage, data pattern, current, or quantity is present. Furthermore, two or more nodes may be realized by one physical element (and two or more signals can be multiplexed, modulated, or otherwise distinguished even though received or output at a common node).

Figure 1:
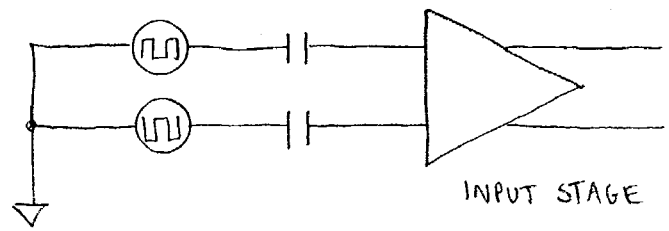
FIG. 1 is a schematic representation of an input stage of an AC coupled circuit, where no manufacturing defects are present.

The circuit and methodology described herein provides a solution to detecting and interfacing high-speed AC coupled non-CMOS logic level signals into logic that is compliant with the JTAG boundary scan testing standard. In addition, this approach is equally applicable to non-CMOS level, single-ended, and differential signals with or without AC coupling. One typical high-speed interface that could be addressed by this approach is one that employs differential 50 Ohm terminated CML signals. FIG. 1 is a schematic diagram of a typical differential input stage having no manufacturing defects (the 50 Ohm terminations are not shown for the sake of clarity). The differential input signal, which includes two complementary components, is AC coupled using two coupling capacitors.

Figure 2:
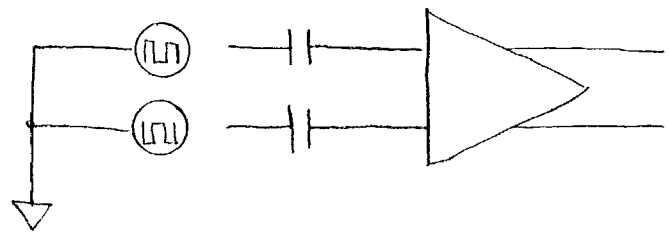
FIGS. 2-8 are schematic representations of an input stage of an AC coupled circuit, where different manufacturing defects are present.
Figure 3:
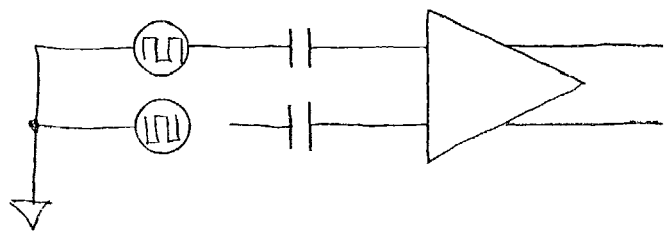
Figure 4:
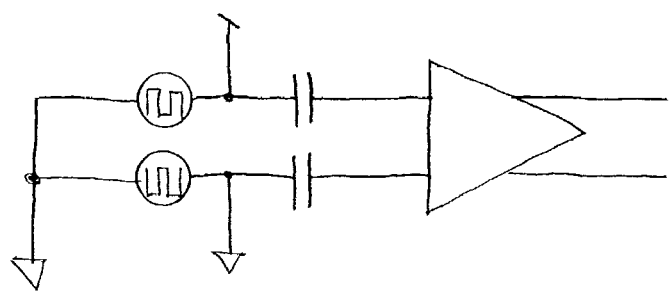
Figure 5:
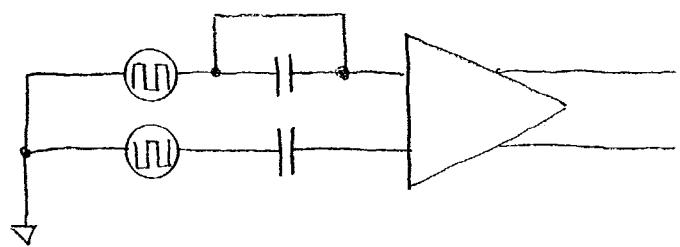
Figure 6:
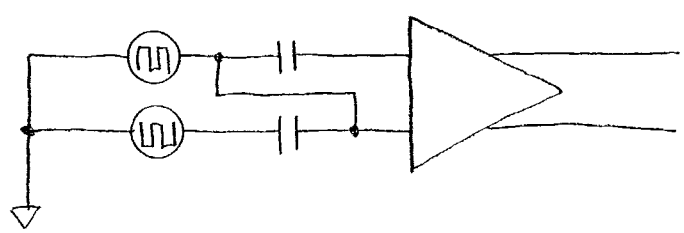
Figure 7:
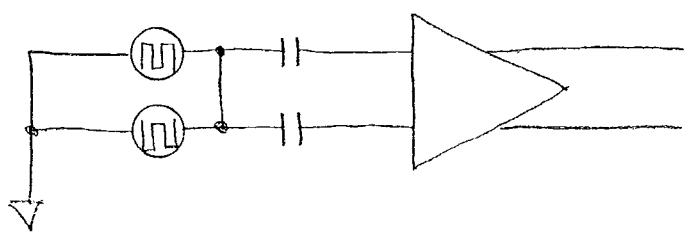
Figure 8:
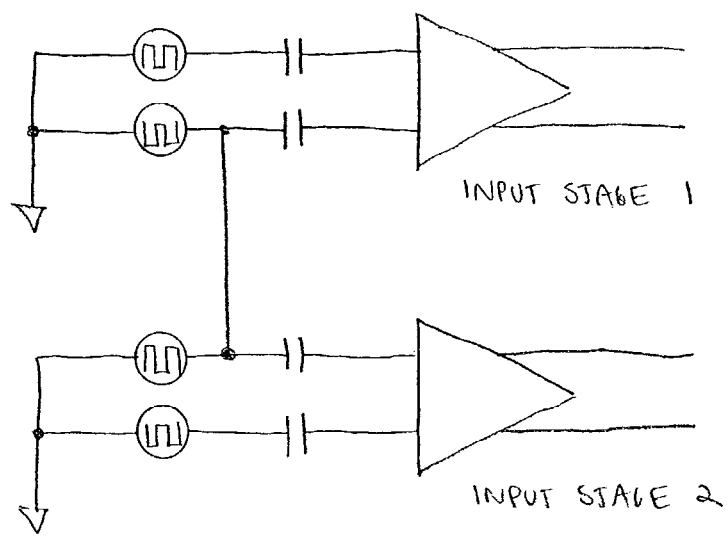

FIGS. 2-8 exemplify the types of manufacturing defects that could be encountered when the circuit of FIG. 1 is actually realized. The different failure modes by which an AC coupled connection can be rendered inoperative by the board manufacturing process include continuity, "stuck-at," bridged, and DC faults. FIG. 2 is a schematic diagram that depicts a manufacturing defect that results in a continuity failure—both inputs are open. FIG. 3 is a schematic diagram that depicts a manufacturing defect that results in another continuity failure—only one of the two inputs is open. FIG. 4 is a schematic diagram that depicts a manufacturing defect that results in a "stuck-at" failure. In this regard, an input can either be stuck at a supply voltage level or at a ground level. FIG. 5 is a schematic diagram that depicts a manufacturing defect that results in a DC failure—one or both of the coupling capacitors may be shorted. FIG. 6 is a schematic diagram that depicts a manufacturing defect that results in another DC failure—namely, a cross bridged capacitor short. FIG. 7 is a schematic diagram that depicts a manufacturing defect that results in a bridging failure—the two inputs are shorted together. FIG. 8 is a schematic diagram that depicts a manufacturing defect that results in another bridging failure—the input signals to adjacent channels are shorted together.

Figure 9:
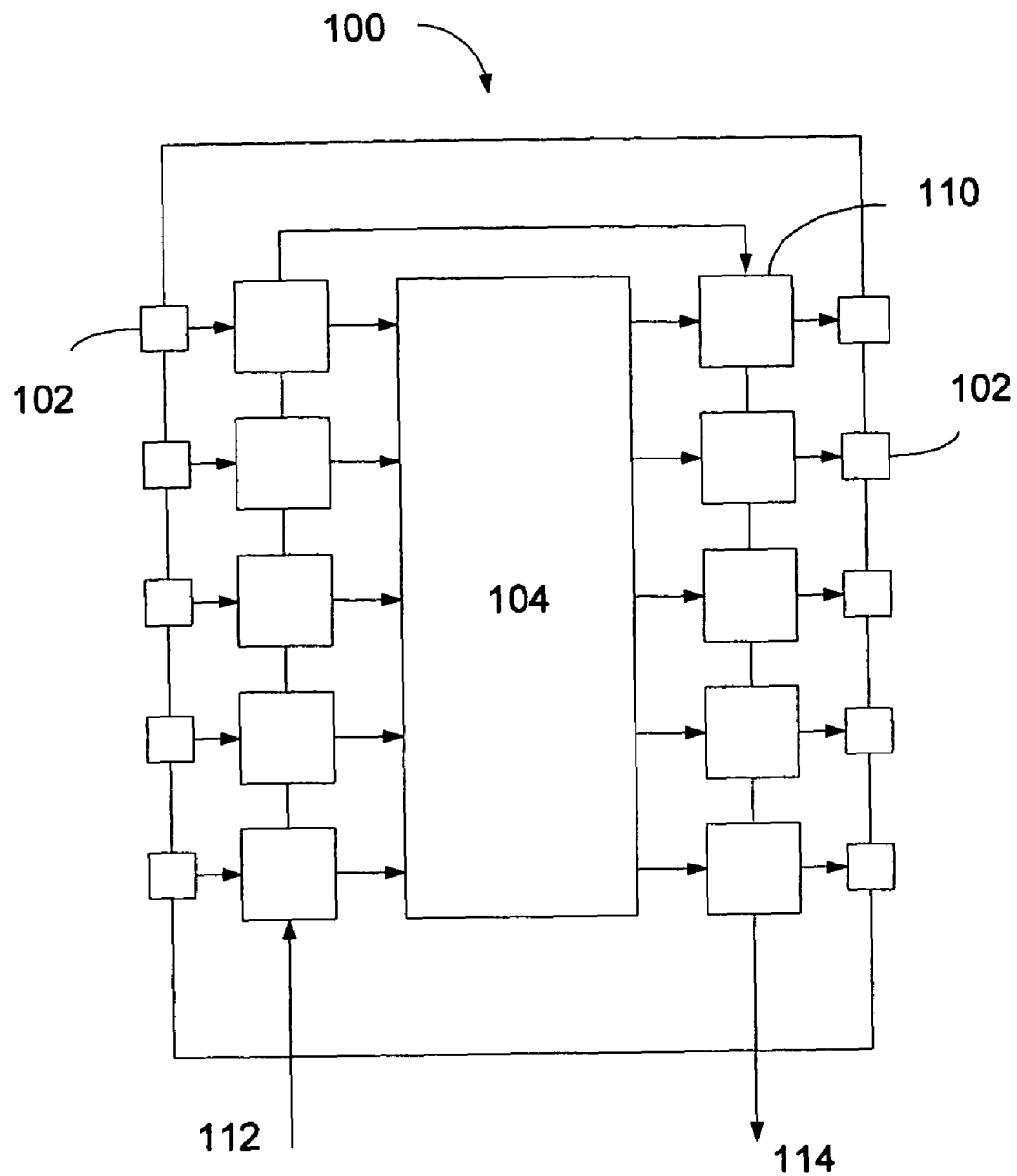
FIG. 9 is a schematic representation of an integrated circuit configured for compliance with the JTAG boundary scan standard.

To facilitate testing of manufacturing defects, many ICs now incorporate the JTAG boundary scan architecture set forth in "IEEE Standard Test Access Port and Boundary-Scan Architecture" (IEEE Standard 1149.1-1990, Institute of Electrical and Electronic Engineers, Inc., 1993). The content of this document is incorporated by reference herein. FIG. 9 is a schematic representation of an IC 100 configured for compliance with the JTAG boundary scan standard. Briefly, IC 100 includes a number of I/O pins 102 that provide external access to a like number of boundary scan cells 110. IC 100, which can be configured in accordance with known technologies and manufacturing techniques, includes an internal core 104 and a plurality of boundary scan cells 110. The specific functionality of core 104 is unimportant for purposes of this description. Indeed, the techniques of the present invention focus on electrical continuity testing of the I/O features of IC 100 rather than the functional testing of core 104. Depending upon the functionality of core 104, a given I/O pin 102 may be an input pin or an output pin. For purposes of this example, core 104 is depicted with a number of outgoing arrows representing outputs and a number of incoming arrows representing inputs.

If IC 100 is compliant with the JTAG boundary scan structure, then it will include (among other features) a test data input ("TDI") node 112, and a test data output ("TDO") node 114. The boundary scan cells 110 are coupled together to form a chain beginning at TDI node 112 and ending at TDO node 114. During testing, the TDI and TDO nodes receive the data input and output signals for the boundary scan chain. The test data output received at the TDO node 114 is ultimately analyzed to determine the extent of manufacturing defects such as continuity and interconnection faults.

Figure 10:
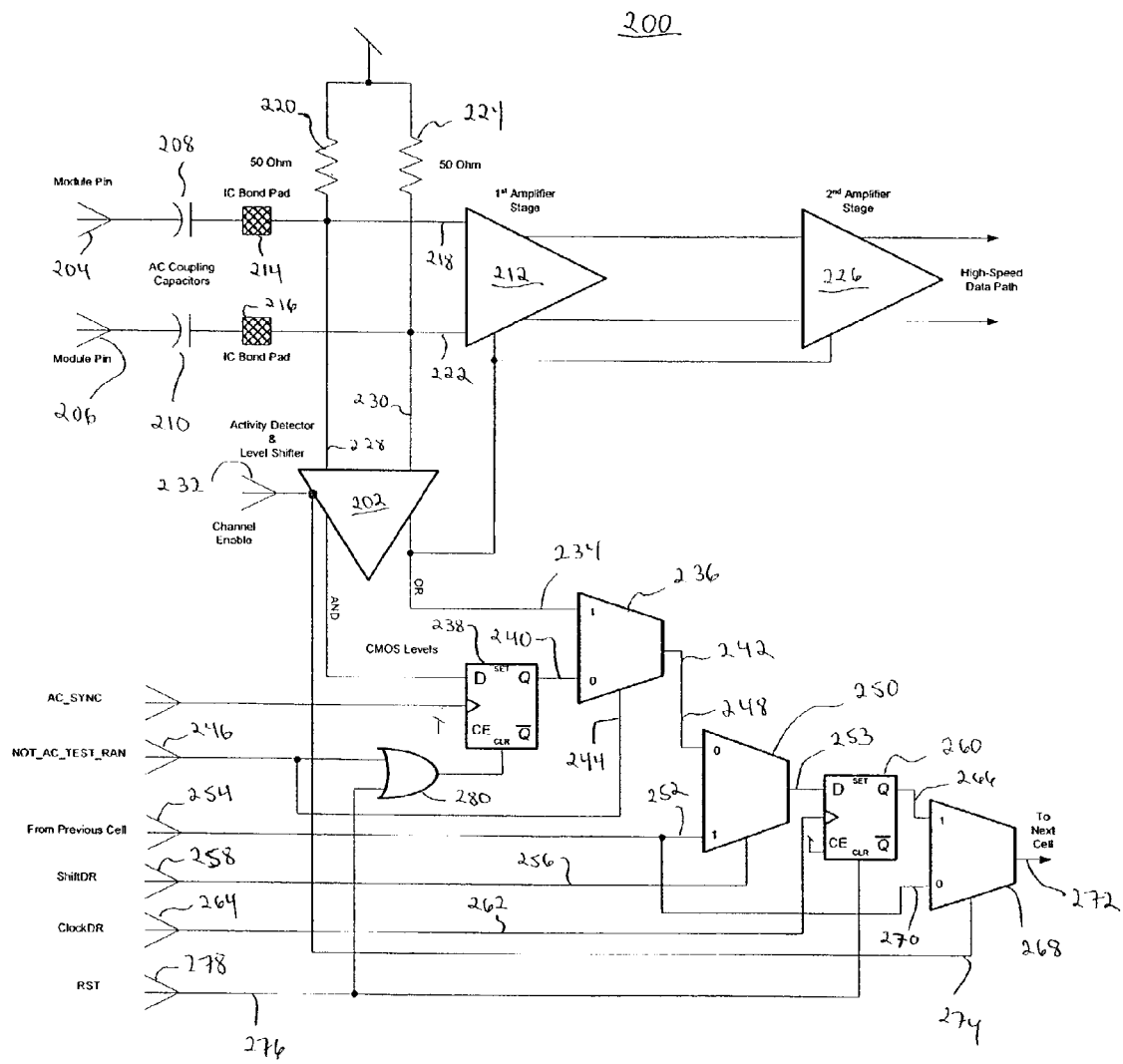
FIG. 10 is a schematic representation of a scan cell that employs an activity detection circuit according to the invention.

All of the above manufacturing faults can be detected with an activity detection circuit that is coupled in parallel with the inputs of the data receiver inputs. FIG. 10 is a schematic representation of a scan cell 200 that employs an activity detection circuit configured in accordance with the invention. The scan cell 200 represents a slight modification of the standard JTAG boundary scan cell. The scan cell 200 makes use of the standard JTAG signals (e.g., ShiftDR, ClockDR, RST, From Previous Cell, and To Next Cell) from the JTAG state machine and boundary scan chain. The activity detection circuit 202 will detect the presence of signals on the AC coupled inputs and will convert (level shift) that result into CMOS logic level outputs that will be coupled into the boundary scan cell. The activity detection circuit 202 is able to detect input signal frequencies from DC to at least the maximum ACJTAG test frequencies. The activity detection circuit 202 can be enabled with the receiver data path circuitry, and the boundary scan cell is logically bypassed if the data path is not enabled.

FIG. 10 depicts a number of module pins corresponding to I/O pins of the IC device. In this regard, a first input module pin 204 receives one of the differential input signal components and a second input module pin 206 receives the complementary differential input signal component. First input module pin 204 is connected to a first AC coupling capacitor 208, and second input module pin 206 is connected to a second AC coupling capacitor 210. These coupling capacitors effectively block the DC components of the input signals. For purposes of this example, a first differential amplifier stage 212 of the IC core is connected to a first IC bond pad 214 and to a second IC bond pad 216. The bond pads represent interconnection points between the IC die and the I/O pins of the device package.

The first input node 218 of amplifier stage 212 is connected to one end of a resistor 220. The second end of the resistor 220 is connected to a supply voltage. In the example embodiment, the resistor 220 is a 50 Ohm resistor. Similarly, the second input node 222 of amplifier stage 212 is connected to one end of a resistor 224. The second end of the resistor 224 is also connected to the supply voltage. In the example embodiment, the resistor 224 is also a 50 Ohm resistor.

The differential output of the first amplifier stage 212 is utilized as a differential input to a second amplifier stage 226. The differential output of the second amplifier stage may be routed in a suitable manner for use as a high-speed signal path.

The first input node 218 is also connected to a first input node 228 of the activity detector circuit 202, and the second input node 222 is also connected to a second input node 230 of the activity detector circuit 202. The activity detector circuit 202 is configured to receive a channel enable signal at an enable I/O pin 232. A first output (labeled "OR" in FIG. 10) of the activity detector circuit 202 is connected to a register circuit via a first input node 234 of a multiplexer 236. A second output (labeled "AND" in FIG. 10) of the activity detector circuit is connected to the register circuit via the "data" input of a flip-flop circuit 238. The register circuit may include the multiplexer 236, the flip-flop 238, a second multiplexer 250, a second flip-flop 260, a third multiplexer and an OR gate 280.

The flip-flop circuit 238, which operates in a conventional manner, also receives the AC_SYNC signal as a clock signal. The data output of the flip-flop circuit 238 is connected to the second input node 240 of the multiplexer 236. In the example embodiment, the data present at the first input node 234 of the multiplexer 236 is output at the multiplexer output node 242 when the multiplexer select signal 244 is a logic high state. On the other hand, the data present at the second input node 240 of the multiplexer 236 is passed to the multiplexer output node 242 when the multiplexer select signal 244 is a logic low state. In the illustrated embodiment, the multiplexer select signal 244 corresponds to the NOT_AC_TEST_RAN signal present at an I/O pin 246.

The output node 242 of multiplexer 236 is connected to one input node 248 of a multiplexer 250. The other input node 252 of the multiplexer 250 is connected to an I/O pin 254 to receive the scan/test pattern data from the previous scan cell. The output of multiplexer 250 is controlled by a select signal 256, which corresponds to the ShiftDR signal present at an I/O pin 258. In the example embodiment, the data present at the input node 248 of the multiplexer 250 is output at the multiplexer output node 253 when the multiplexer select signal 256 is a logic low state. On the other hand, the data present at the input node 252 of the multiplexer 250 is passed to the multiplexer output node 253 when the multiplexer select signal 256 is a logic high state.

The output of multiplexer 250 is connected to the "data" input of another flip-flop circuit 260. The flip-flop circuit 260 also receives the ClockDR signal 262 (present at an I/O pin 264) at its clock input node. The data output of the flip-flop circuit 260 is connected to a first input node 266 of a multiplexer 268. The data from the previous scan cell is also provided at a second input node 270 of the multiplexer 268. The output of the multiplexer 268 represents the output of the scan cell 200, which is passed on the next scan cell. Of course, if the scan cell 200 is the last cell in the chain, then the output of the multiplexer 268 corresponds to the test data output signal. The multiplexer 268 is controlled by a select signal 274. In this example, the select signal 274 corresponds to the channel enable signal present at I/O pin 232. In the example embodiment, the data present at the first input node 266 of the multiplexer 268 is output at the multiplexer output node 272 when the multiplexer select signal 274 is a logic high state. On the other hand, the data present at the second input node 270 of the multiplexer 268 is passed to the multiplexer output node 272 when the multiplexer select signal 274 is a logic low state.

A reset ("RST") signal 276 is received at an I/O pin 278. The RST signal 276 is connected to the clear ("CLR") input of the flip-flop circuit 260, and to one input of an OR gate 280. The NOT_AC_TEST_RAN signal serves as the other input to the OR gate 280, as shown in FIG. 10. The output of the OR gate 280 is connected to the CLR input of the flip-flop circuit 238.

FIG. 10 illustrates JTAG scan cell architecture, modified according to the invention. Standard, unmodified JTAG scan cell architecture includes the multiplexer/flip flop/multiplexer sequence 250, 260, 268, under the control of signals ShiftDR, ClockDR, and RST, with Previous and Next Cell connections. The AC_SYNCH and Not_AC_Test_Ran signals, and the associated flip-flop 238 have been proposed in the ACJTAG modification of the JTAG scan cell architecture. By provision of the activity detection circuit and multiplexer 236, our invention provides a fully integrated JTAG scan cell architecture in which the ACJTAG digital logic for testing the pattern on an AC signal is interfaced to the high speed AC coupled signal lines into the input nodes 218, 222. In this regard, the activity circuit 202 detects the presence of signals on the AC coupled inputs and converts (for example by level shifting) those signals into CMOS logic level outputs that are coupled into the boundary scan cell. The activity circuit 202 imposes a minimum amplitude threshold on the signals and provides a degree of hysteresis to avoid chattering. The activity circuit is enabled by the receiver data path circuitry (resistors 220, 224).

Referring again to the example circuit of FIG. 1, and to the scan cell architecture of FIG. 10, if the two receiver data inputs (at module pins 204, 206, for example) are connected correctly, then, in normal operation, the two inputs of the receiver channel (amplifier stages 212, 226, et seq.) will be driven out of phase with adequate amplitudes to ensure a deterministic output from the receiver input stage. In some situations, however, it may be necessary for testing purposes to allow the receiver channel to be driven single-ended as well (an AC input on only module pin 204, for example). This condition would seem to correspond to (and to be confused with) the "single input open" fault condition shown in FIG. 3. Consequently, two logical outputs from the activity detection circuit 202 are utilized to accommodate the different requirements of the test versus the functional operation.

Referring to FIG. 10, the "OR" output of the activity detection circuit 202 pertains to the functional verification of an available signal. This signal will assert whenever the differential input signal level exceeds a minimum threshold. The assertion does not necessarily guarantee that there is a signal on both inputs, but does guarantee that the minimum differential input signal level has been received (i.e., only one input may be driven, but the amplitude is adequate to realize a deterministic output from the receiver input). In terms of a logical expression, this signal can be represented by:

OR=activity_on_noninverting_input+activity_on_inverting_input

This logical OR signal can also be used to enable other receiver circuitry to realize a power savings in the absence of an input signal or to indicate a detected signal in the JTAG EXTEST mode. In this regard, the OR signal output of the activity detection circuit is also connected to the enable inputs of the first amplifier stage 212 and the second amplifier stage 226.

Referring again to FIG. 10, the "AND" output of the activity detection circuit 202 pertains to the JTAG testing verification. The AND output also embodies the logical state of the input data stream. For example, if there is a signal on both receiver data inputs and they correspond to a logical '0' state, then the "AND" output will indicate a zero. Conversely if there is a on both receiver data inputs and they correspond to the logical '1' state, then the AND output will indicate a one. If there is no input signal on one or both receiver data inputs, then the AND output will always indicate a '0' logic level. In terms of a logical expression, this signal can be represented by:

AND=activity_on_noninverting_input & activity_on_inverting_input & input_equivalent_logical_state According to this expression, if a known AC data pattern is driven into the data receiver inputs (218,222) the activity circuit 202 will produce a signal on its AND output that replicates those patterns on the condition that there is a viable connection driving those inputs. Otherwise, a zero output will always exist, indicating or corresponding to a fault. Other encoding formats for the AND signal are possible as well.

In view of these considerations, the invention enables the detection of any of the defects illustrated in FIGS. 2-4 and 7 using the ACJTAG test mode when the flip flop 238 is operating in response to AC_SYNCH and NOT_AC_TEST_RAN as having either one or neither inputs driven with representative data. Detection of the remaining bridging defect (FIG. 8) requires that the two data channels be driven with complementary data patterns. When driven in-phase, the shorted inputs will result in the CML output drivers delivering a viable waveform (half the load resistance and twice the drive current). Driving out of phase, however, will ideally result in a waveform that remains constant at the common mode voltage (half the resistance and a single amount of drive current). In practice, one might find spurious glitching on the waveform and some DC level deviation due to mismatch in the output driver's load resistance and drive currents and also to channel-to-channel skew. Low pass filtering would be expected to suppress these effects and permit reliable detection of a single-ended drive waveform and the identification of the fault. The DC failures illustrated in FIGS. 5 and 6 can be identified by use of the IEEE 1149 standard EXTEST (DC Voltage) test mode in which the activity circuit 202 should detect no viable input on either input over a period of time in which the coupling capacitors (208, 210) settle in response to the initial application of the DC drive signal. Consequently, it is necessary to know the state of the OR signal in this mode to validate the absence of an incoming signal. If signal presence is detected, it will be assumed that one of the input capacitors is shorted.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A boundary scan cell, comprising:
   an AC signal activity detector in the boundary scan cell and coupled to detect an AC signal on an IC board interconnect having two differential signal lines;
   the AC signal activity detector including first and second inputs coupled to the differential signal lines, a logical AND output for representing an input signal on both of the differential signal lines, and a logical OR output for representing an input signal on either one of the differential signal lines; and
   a register circuit coupled to the AC signal activity detector for receiving the AND and OR outputs of the AC signal activity detector, wherein the register circuit includes:
   a first flip-flop coupled to receive an output from the AC signal activity detector AND output; and
   a second flip-flop coupled to receive an output from a selector that selects one of the AND output and the OR output of the AC signal activity detector.

2. The boundary scan cell of claim 1, wherein the second flip-flop is coupled with a previous boundary scan cell via a scan chain input.

3. The boundary scan cell of claim 1, wherein the second flip-flop is coupled with a next boundary scan cell via a scan chain output.

4. The boundary scan cell of claim 1, wherein the AC signal activity detector includes a level-shifter for converting a detected AC signal into a CMOS logic signal.

5. A method of testing AC-coupled IC board interconnects with a plurality of boundary scan cells, comprising:
   detecting the presence of AC signal activity with an AC signal activity detector in at least one of the plurality of the boundary scan cells on a differential pair of signal lines of an interconnect to the boundary scan cell;
   providing a logical AND output representing input signal activity on both of the differential signal lines and a logical OR output representing input signal activity on either one of the differential signal lines; and
   receiving at a first flip-flop of a register circuit an output from the AC signal activity detector AND output; and
   receiving at a second flip-flop of the register circuit an output from a selector that selects one of the AND output and the OR output of the AC signal activity detector.

6. The method of claim 5, further comprising invoking a test mode to enable the detecting.

7. The method of claim 5, further comprising shifting the result from the register circuit to an output.

8. The method of claim 5, further including converting a detected AC signal into a CMOS logic signal.

9. A boundary scan circuit for testing a plurality of IC board interconnects, comprising:
   a plurality of serially-coupled boundary scan cells, in which each boundary scan cell comprises:
   an AC signal activity detector coupled to an IC board interconnect having two differential signal lines, the AC signal activity detector including first and second inputs coupled to the differential signal lines, a logical AND output for representing an input signal on both of the differential signal lines, and a logical OR output for representing an input signal on either one of the differential signal lines; and
   a register circuit coupled to the AC signal activity detector for receiving the AND and OR outputs of the AC signal activity detector, wherein the register circuit of each boundary scan cell comprises:
   a first flip-flop coupled to receive an output from the AC signal activity detector AND output; and
   a second flip-flop coupled to receive an output from a selector that selects one of the AND output and the OR output of the AC signal activity detector.

10. The boundary scan circuit of claim 9, wherein at least one boundary scan cell of the plurality of boundary scan cells includes an output connected with a next serially-coupled boundary scan cell.

* * * * *